(12) United States Patent
Wang et al.

(10) Patent No.: US 7,983,102 B2
(45) Date of Patent: Jul. 19, 2011

(54) DATA DETECTING APPARATUS AND METHODS THEREOF

(75) Inventors: Shih-Hsing Wang, Hsinchu (TW);
Der-Min Yuan, Taipei County (TW);
Bor-Doou Rong, Hsinchu County (TW);
Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 63 days.

(21) Appl. No.: 12/579,920

(22) Filed: Oct. 15, 2009

(65) Prior Publication Data
US 2010/0103753 A1   Apr. 29, 2010

(30) Foreign Application Priority Data
Oct. 29, 2008 (TW) .............................. 97141519 A

(51) Int. Cl.
*G11C 7/00* (2006.01)
(52) U.S. Cl. .................... 365/203; 365/194; 365/185.25
(58) Field of Classification Search .................. 365/203, 365/194, 185.25
See application file for complete search history.

(56) References Cited

U.S. PATENT DOCUMENTS

| | | | | |
|---|---|---|---|---|
| 4,884,241 A | * | 11/1989 | Tanaka et al. | 365/185.21 |
| 4,969,125 A | * | 11/1990 | Ciraula et al. | 365/203 |
| 5,502,684 A | * | 3/1996 | Koshikawa | 365/189.15 |
| 5,590,086 A | * | 12/1996 | Park et al. | 365/230.03 |
| 5,859,547 A | * | 1/1999 | Tran et al. | 326/98 |
| 5,982,688 A | * | 11/1999 | Han | 365/203 |
| 5,995,430 A | * | 11/1999 | Yabe | 365/203 |
| 6,144,600 A | * | 11/2000 | Ogura | 365/185.25 |
| 6,545,922 B2 | * | 4/2003 | Nakazawa | 365/203 |
| 6,559,669 B2 | * | 5/2003 | Sugamoto et al. | 324/750.3 |
| 6,635,934 B2 | * | 10/2003 | Hidaka | 257/369 |
| 6,909,653 B2 | * | 6/2005 | Shimadu et al. | 365/203 |
| 7,046,565 B1 | * | 5/2006 | Barth et al. | 365/203 |
| 7,061,803 B2 | * | 6/2006 | Kim | 365/185.17 |
| 7,154,795 B2 | * | 12/2006 | Parris et al. | 365/203 |
| 7,397,715 B2 | * | 7/2008 | Lim et al. | 365/201 |
| 7,518,938 B2 | * | 4/2009 | Yoo | 365/203 |
| 7,548,468 B2 | * | 6/2009 | Kawabata et al. | 365/189.11 |
| 7,710,804 B2 | * | 5/2010 | Ko | 365/203 |
| 7,768,852 B2 | * | 8/2010 | Yoo | 365/203 |

* cited by examiner

*Primary Examiner* — Viet Q Nguyen
(74) *Attorney, Agent, or Firm* — Muncy, Geissler, Olds & Lowe, PLLC

(57) ABSTRACT

A data detecting apparatus and a data detecting method are disclosed in the embodiments of the present invention. The data detecting apparatus operates according to a clock signal with a predetermined period. The data detecting apparatus comprises a plurality of memory cells, a plurality of data lines, a plurality of bit lines, a plurality of sense amplifiers and a pre-charge control circuit.

11 Claims, 7 Drawing Sheets

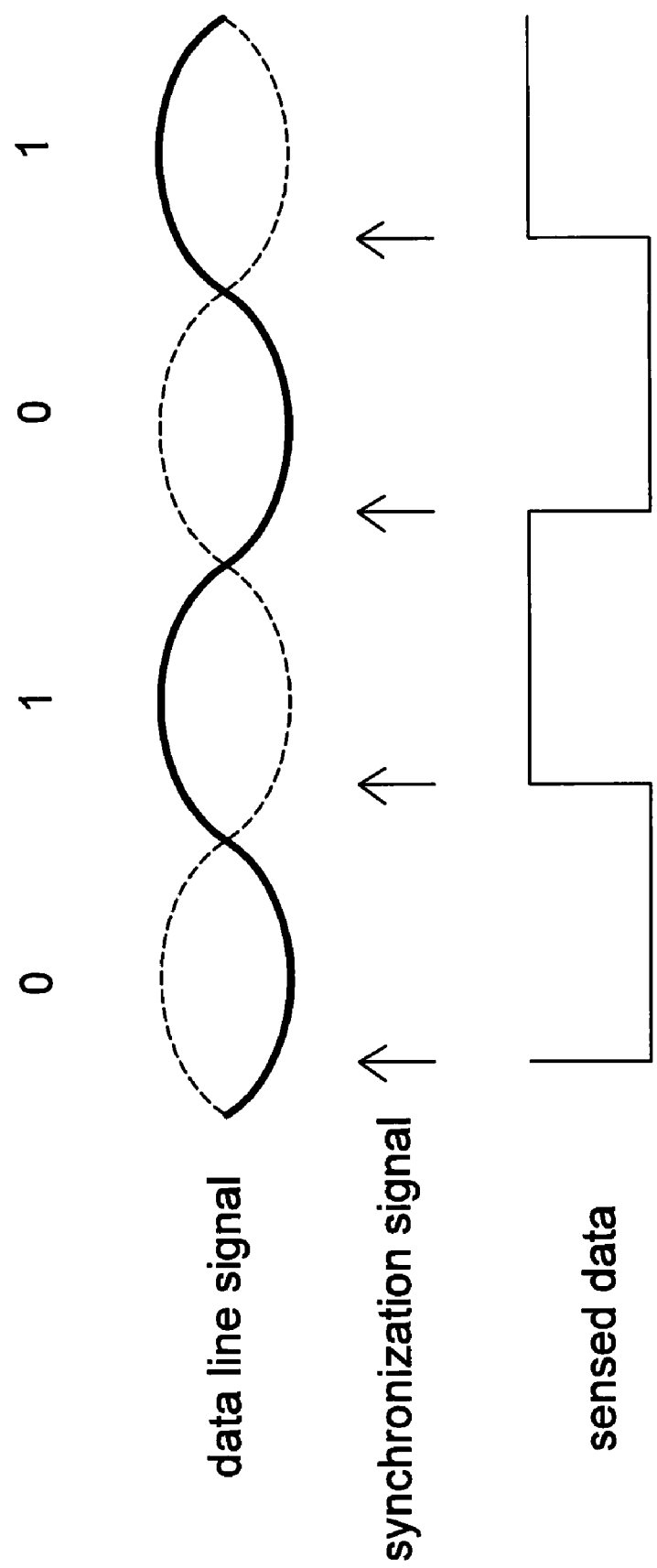

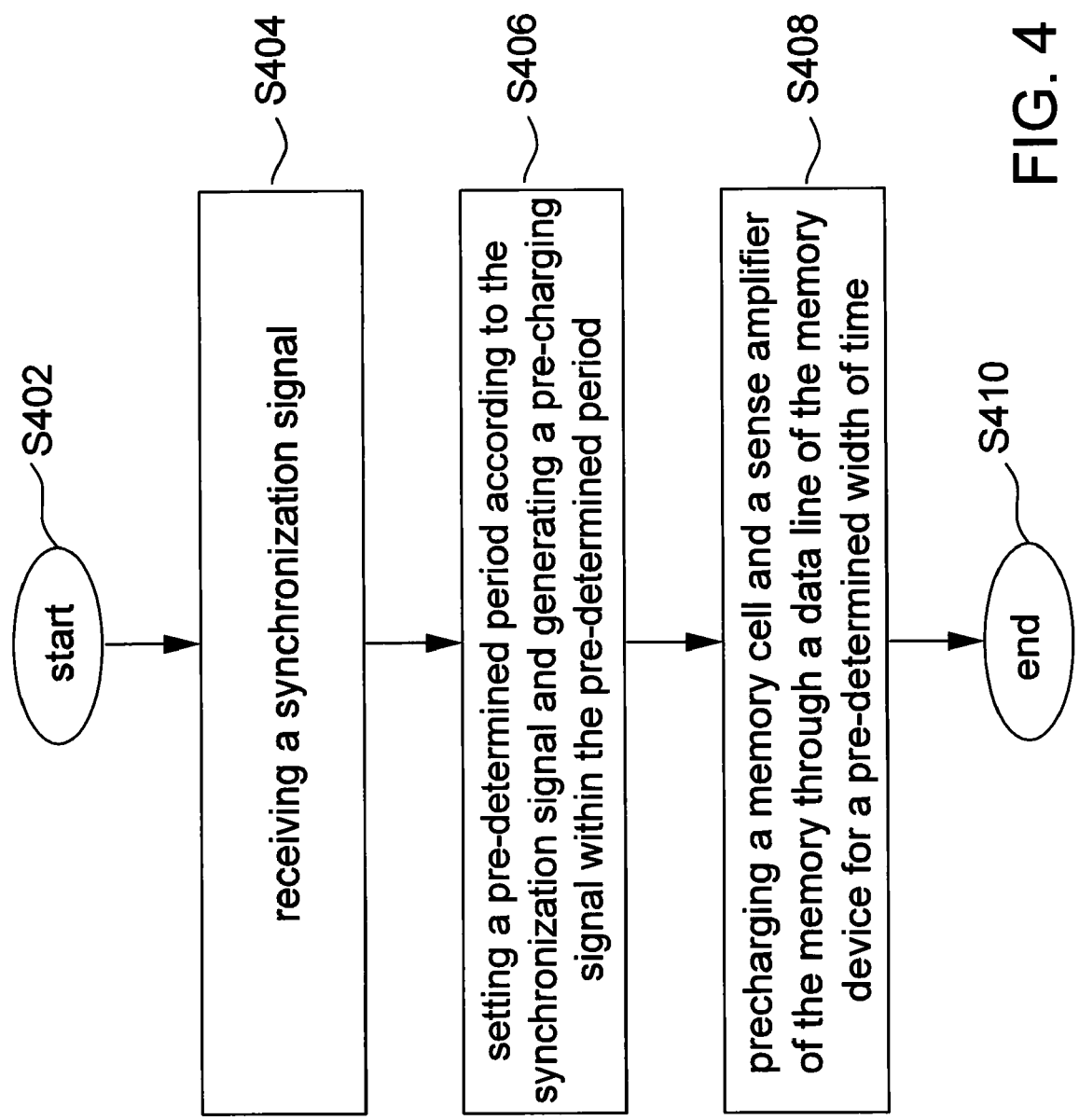

DATA DETECTING APPARATUS AND METHODS THEREOF

BACKGROUND OF THE INVENTION (a) Field of the Invention

The present invention relates to a data detecting apparatus, and particularly to a data detecting apparatus capable of pre-charging.

(b) Description of the Related Art

Accompanying with the advance in the semiconductor manufacturing processes, the area and the working voltage of a transistor is becoming smaller. Therefore, the current electronic circuit is able to operate at higher speed and the chip area is also becoming more and more miniaturized.

Besides, a memory circuit, such as: the dynamic random access memory (DRAM), includes a lot of data lines and bit lines.

When the memory capacity becomes larger to make the wiring lengths of the data line and the bit line be longer, the signal cumulating effect will happen in the data line and the bit line. As shown in FIG. 1A, if the logic value of the data line signal is not at constant value, such as: the logic values of 0, 1, 0, 1 shown in the figure, the signal cumulating effect does not exist or is not obvious and the circuit can correctly detect the data presented by the logic values of 0, 1, 0, 1. However, when the plurality of data lines receive a signal of the same logic value for a longer period of time, such as: continuously receiving the successive three logic values of 0, such as the logic values of 0, 0, 0, 1 as shown in FIG. 1B, the signal cumulating effect often becomes quite serious. Together with the fast operating speed of the memory system and the small working voltage range, such signal cumulating effect can easily cause the situation of incorrectly converting the logic value while converting logic value, such as: the data detected become logic values of 0, 0, 0, 0. Therefore, erroneously reading/writing the data of the memory will happen.

BRIEF SUMMARY OF THE INVENTION

Therefore, in order to resolve the above mentioned problems, one object of the invention is to provide a data detecting apparatus that can pre-charge in a short period of time.

One object of the invention is to provide a data detecting apparatus that can resolve the erroneous reading problem caused by the signal cumulating effect.

According to one embodiment of the invention, a data detecting apparatus that operates according to a first synchronization signal is provided. The data detecting apparatus includes a plurality of memory cells, a plurality of data lines, a plurality of sense amplifiers, and at least one pre-charging circuit. The plurality of memory cells store data. The plurality of data lines couple to the plurality of memory cells separately for controlling reading or writing the plurality of memory cells. The plurality of bit lines couple to the plurality of memory cells separately for outputting data stored in the plurality of memory cells. The plurality of sense amplifiers couple to the plurality of bit lines separately for amplifying the data outputted from the plurality of memory cells. The pre-charging circuit sets a pre-determined period of time according to the first synchronization signal, generates a pre-charging signal within the pre-determined period of time, and charges the memory cells and the sense amplifiers via the data lines.

According to one embodiment of the invention, a pre-charging circuit that provides pre-charging to the target circuit that produced cumulative errors during signal propagation. The pre-charging circuit includes a synchronization controller, a delay circuit, and a pre-charging pulse generator. The synchronization controller generates a second synchronization signal according to a read/write signal and a first synchronization signal wherein the first synchronization signal operates synchronously with the target circuit. The delay circuit delays the first synchronization signal to generate a delayed third synchronization signal. The pre-charging pulse generator generates the pre-charging signal according to the second synchronization signal and the third synchronization signal.

The pre-charging circuit sets a pre-determined period according to the first synchronization signal, generates the pre-charging signal within the pre-determined period, and charges the target circuit.

According to one embodiment of the invention, a data detecting method applicable to a memory device is provided. The method includes the following steps. At first, a synchronization signal is received. Then, a pre-determined period of time is set according to the synchronization signal and a pre-charging signal is generated within the pre-determined period. Thereafter, a memory cell and a sense amplifier of the memory are pre-charged through a data line of the memory device for a pre-determined width of time.

By way of the above mentioned techniques, the pre-charging technique according to the embodiments of the invention pre-charges the target circuit for a pre-determined width of time during a pre-determined period of time. Thus, the problem of erroneous data reading caused by various circuit signal cumulating effects can be resolved.

BRIEF DESCRIPTION OF THE DRAWINGS

FIG. 1A shows a schematic diagram illustrating the normal signal waveform in the prior art;

FIG. 4 shows a flow chart illustrating the data detecting method according to one embodiment of the invention.

DETAILED DESCRIPTION OF THE INVENTION

Figure 1B:
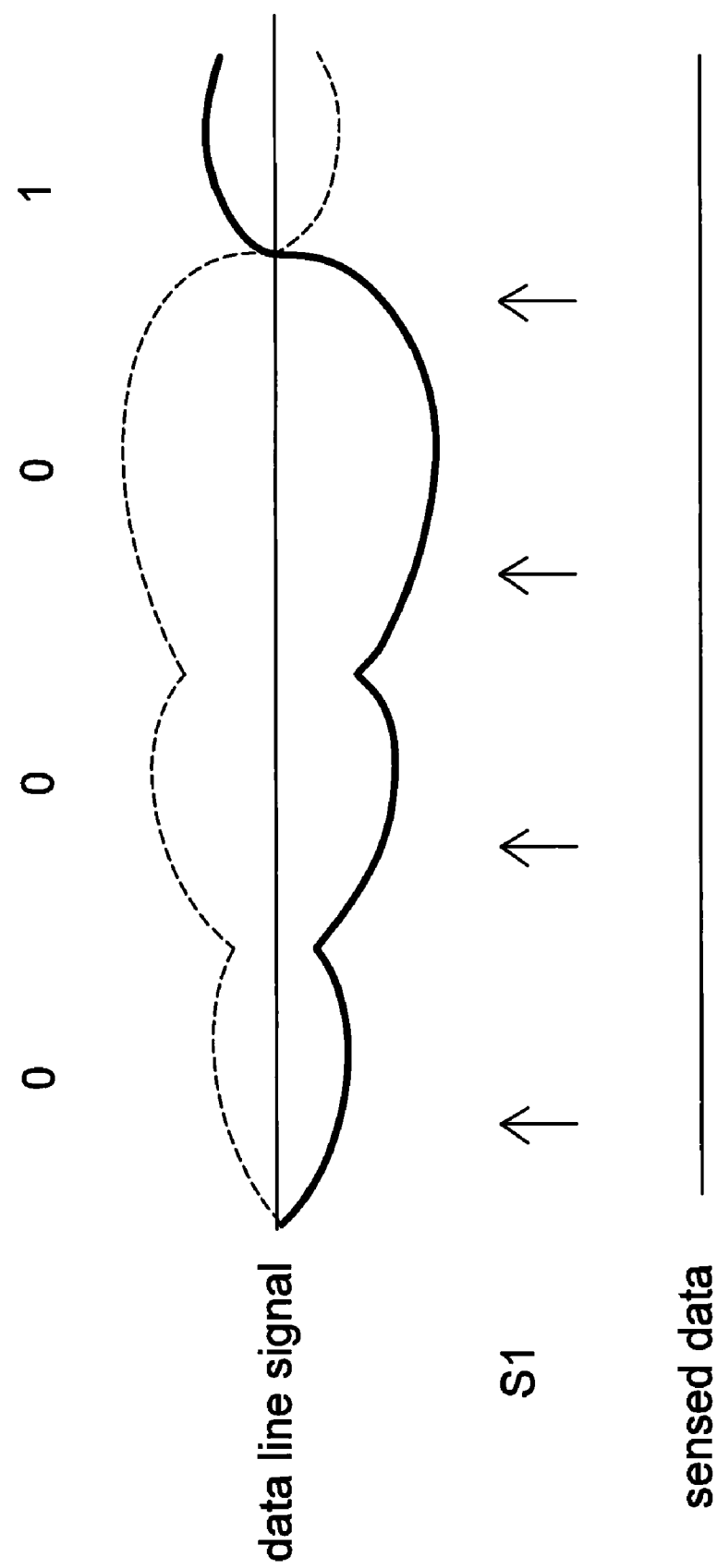
FIG. 1B shows a schematic diagram illustrating the signal waveform with signal cumulating effect in the prior art.
Figure 2A:
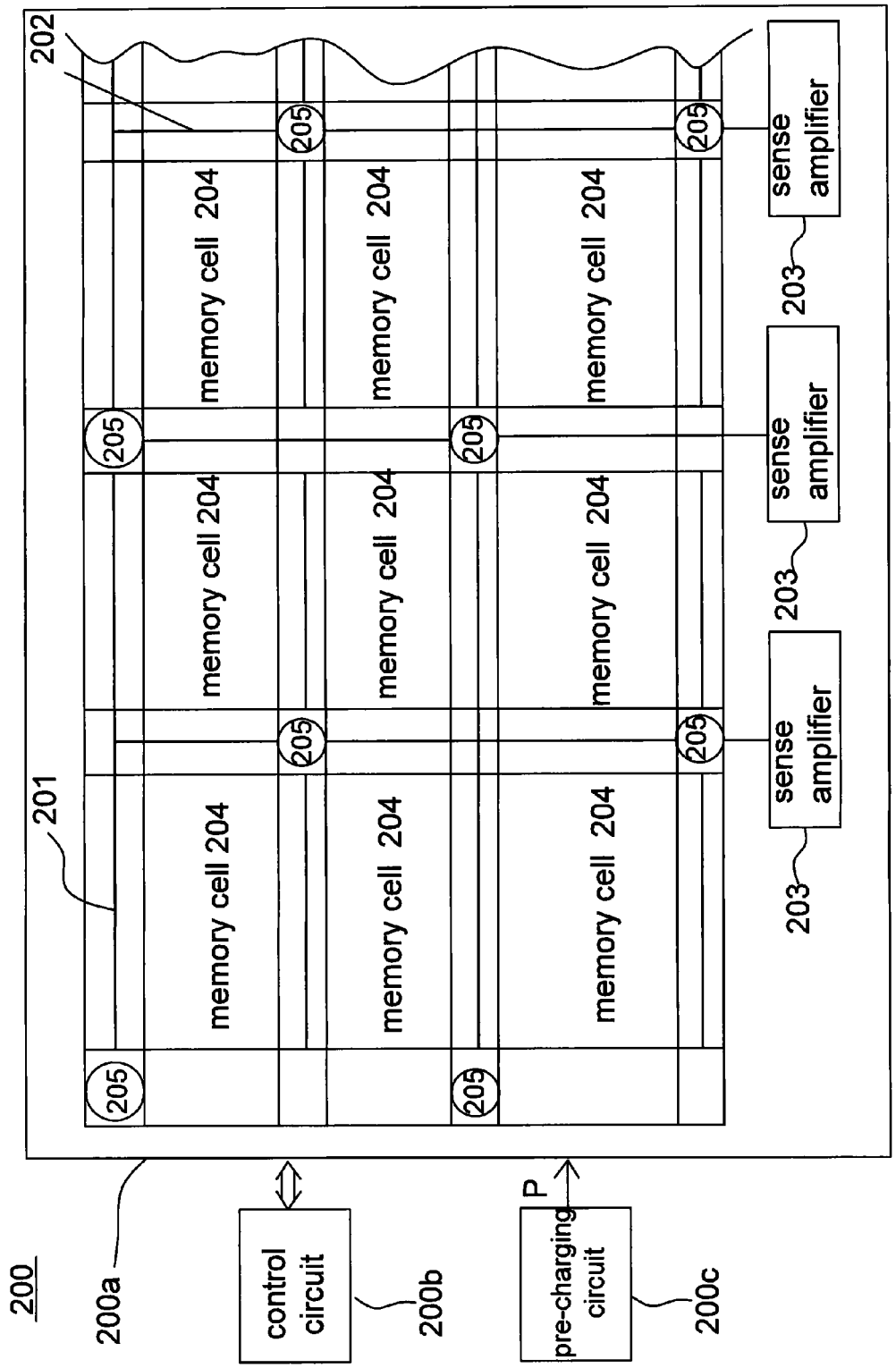
FIG. 2A shows a schematic diagram illustrating the data detecting device according to one embodiment of the invention.
Figure 2B:
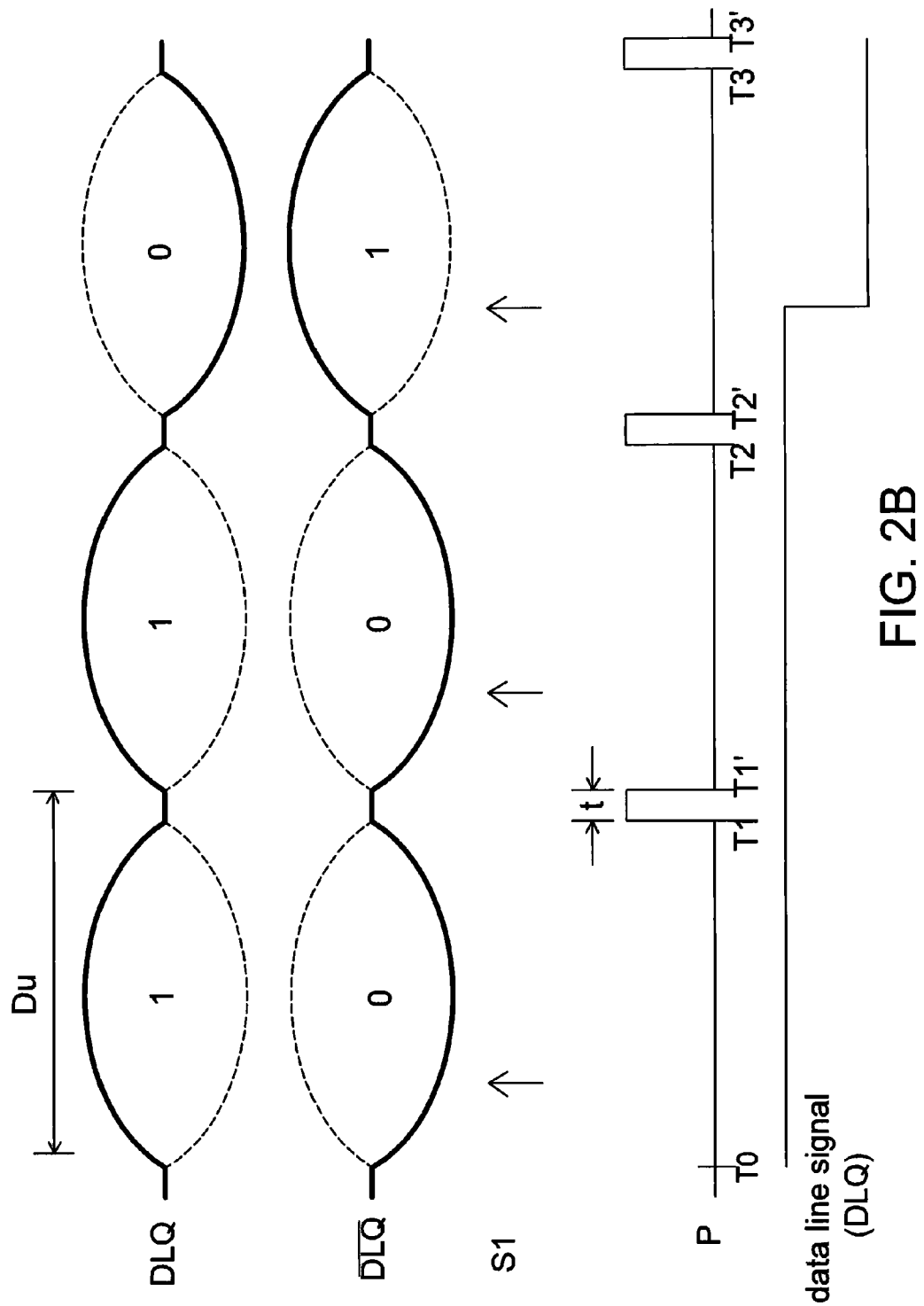
FIG. 2B shows a schematic diagram illustrating the signal waveform of FIG. 2A.

Please refer to the FIGS. 2A and 2B simultaneously. FIG. 2A shows a schematic diagram illustrating part of the circuit of the data detecting apparatus according to one embodiment of the invention while FIG. 2B shows a schematic diagram illustrating the signal waveform of the data detecting apparatus shown in FIG. 2A.

The data detecting apparatus 200, shown in FIG. 2A, includes a memory array circuit 200a, a control circuit 200b, and at least one pre-charging circuit 200c.

The memory array circuit 200a includes a plurality of data lines 201, a plurality of bit lines 202, a plurality of sense amplifier 203, a plurality of memory cells 204 and a plurality of data line switches 205 that couple to each other as shown in the figure. The data lines 201 read data from the memory cells 204 or write data into the memory cells 204 via the data line switches 205. The sense amplifiers 203 couple to the bit lines 202 for amplifying the data signal outputted from the bit lines 202.

The control circuit 200b is to control the operation the memory array circuit 200a to perform reading/writing or the like.

The pre-charging circuit 200c couples to the memory array circuit 200a to output a nimble pre-charge signal P for performing pre-charging operation to the memory array circuit 200a. The nimble pre-charging signal P can be a pulse signal.

The operating principle of the data detecting apparatus 200 according to one embodiment of the invention will be described in detail in the following.

The data detecting apparatus 200 according to one embodiment of the invention is designed to have a pre-charging circuit 200c for pre-charging the memory array circuit 200a according to the charging method shown in FIG. 2B. The nimble pre-charge signal P outputted by the pre-charging circuit 200c according to this embodiment pre-charges the data line signal for a pre-set width of time t within a pre-set duration Du. In one example shown in FIG. 2B, the pre-charging circuit 200c performs pre-charging operation on the data line switch 205 and the sense amplifier 203 via the data line 201 for the pre-set width of time t (such as time T1~T1') that is less than 0.5 nanosecond within a half clock period of the pre-set duration Du (such as between time T0 and T1'). Thus, the voltage level of the data line signal DLQ is back to a pre-set voltage within each half clock period to avoid the problem of the signal cumulating. Thereby, the timing delay during the logic transition of the data line signal can be avoided and the data reading or writing error of the sense amplifier is prevented from happening.

It should be noted that the pre-set duration Du and the pre-set period of time t of the nimble pre-charging signal P set by the pre-charging circuit 200c in one embodiment can be designed according to the requirement of the circuit designer or the characteristics of the memory. For example, the pre-charging circuit 200c may pre-charge the data line switch 205 and the sense amplifier 203 once via the data line 201 during at least a preset period of the synchronization signal S1. In one embodiment, the pre-charging circuit 200c only needs to perform the pre-charging operation just before the signal accumulating effect exceeds the tolerable range.

Although the pre-charging circuit 200b pre-charges the data line switch and the sense amplifier via the data line, in one embodiment, the invention is not limited such an example. The invention can be applied to any circuit of the memory that suffers from the data reading error induced by signal accumulating effect. Obviously, the technique according to the invention can be applied to a variety of circuits other than the memory circuit, such as processors, various chips, application chips, or the like. As long as the problem of the signal accumulating effect occurs, it is to be encompassed by the scope of the present invention.

Figure 3A:
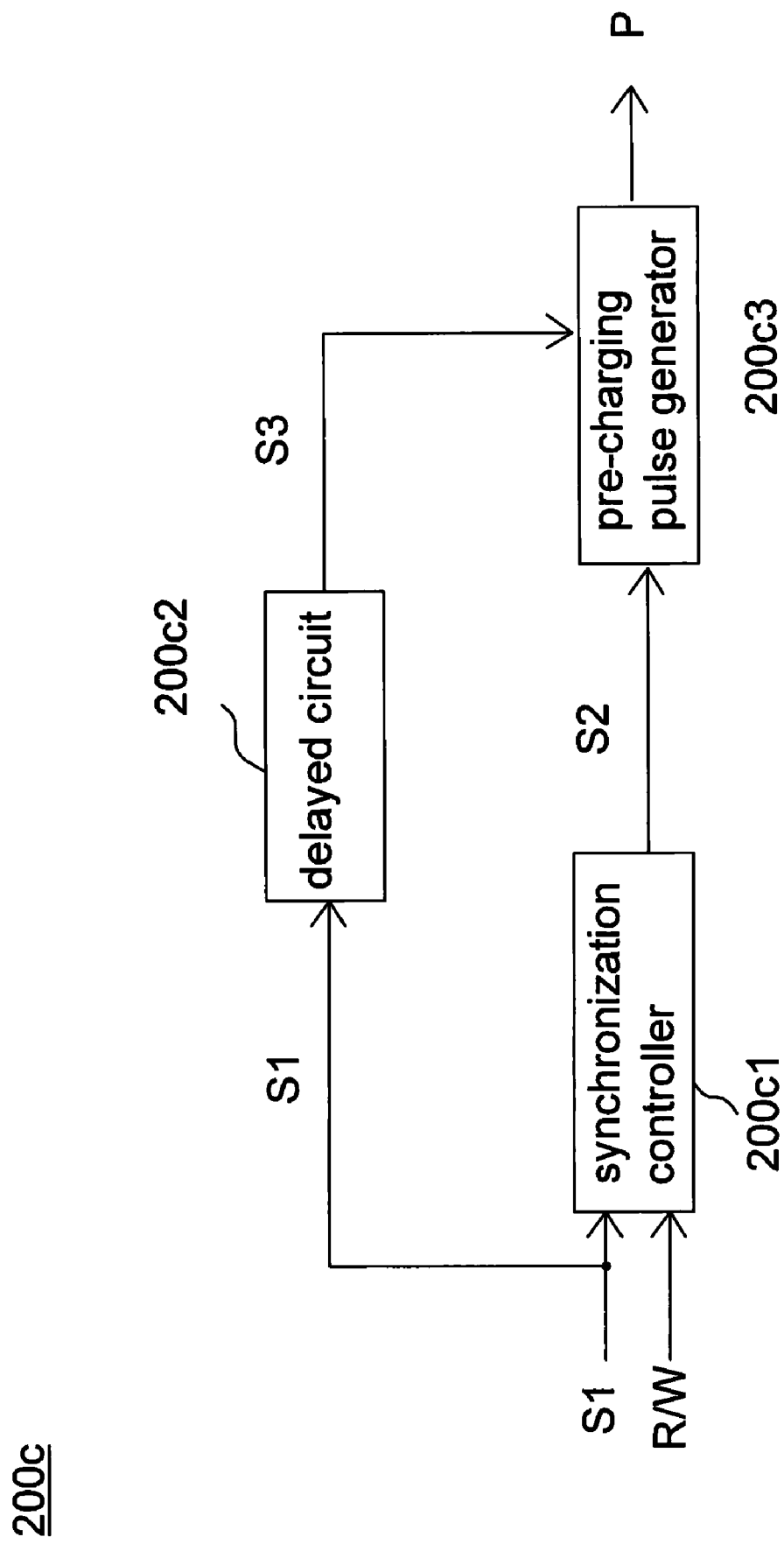
FIG. 3A shows a schematic diagram illustrating the pre-charging circuit according to one embodiment of the invention.
Figure 3B:
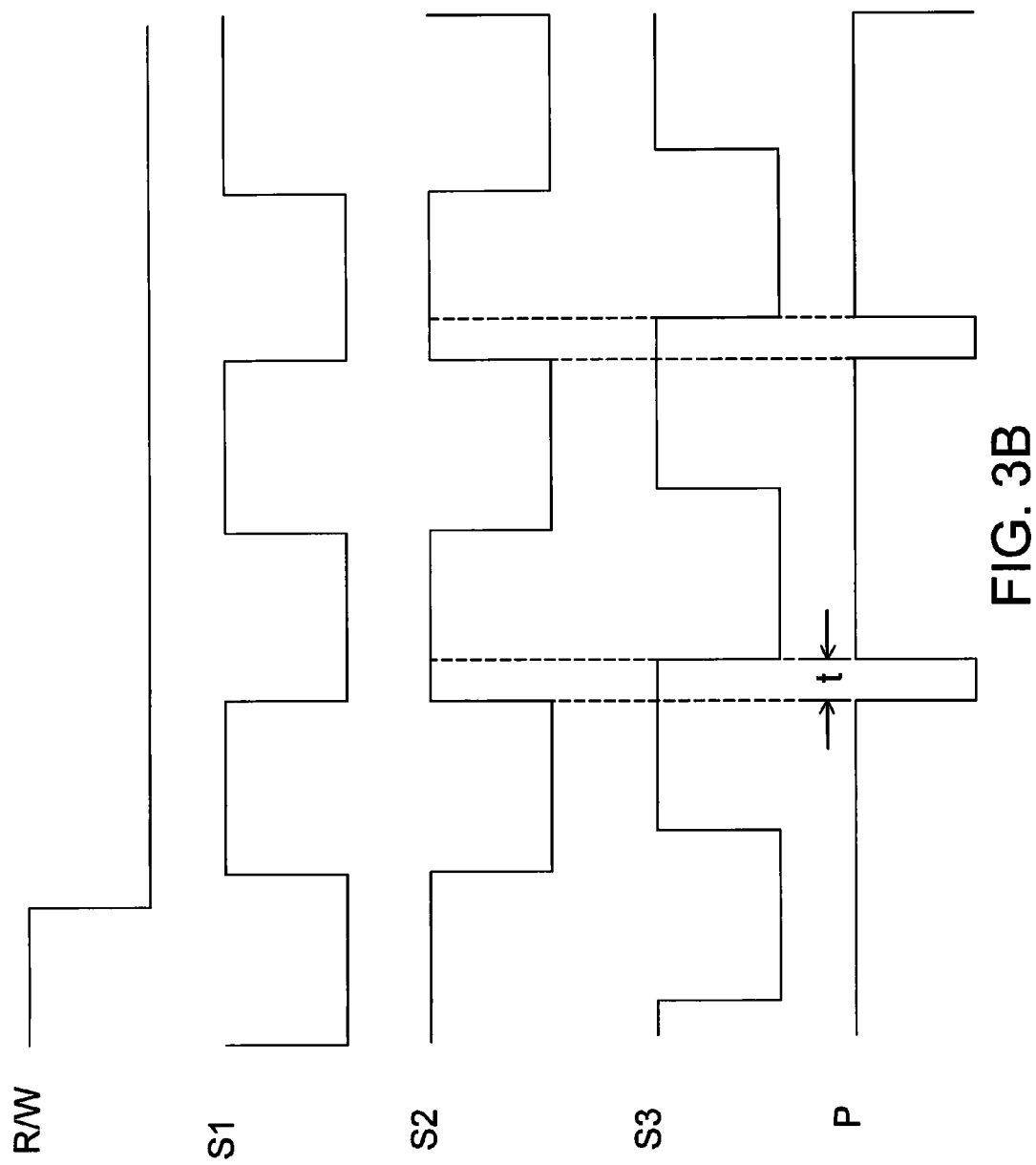
FIG. 3B shows a schematic diagram illustrating the signal waveform of FIG. 3A.

Please refer to the FIGS. 3A and 3B simultaneously. FIG. 3A shows a schematic diagram illustrating the pre-charging circuit according to one embodiment of the invention while FIG. 3B shows a schematic diagram illustrating the signal waveform of the circuit shown in FIG. 3A.

The pre-charging circuit 200c includes a synchronization controller 200c1, a delay circuit 200c2, and a pre-charging pulse generator 200c3. The operating method of the pre-charging circuit is given by the following.

The synchronization controller 200c1 generates a second synchronization signal S2 according to a read/write signal R/W and a first synchronization signal S1. In one embodiment, the synchronization controller 200c1 outputs the second synchronization signal S2 that is mutually reversed-phase with the first synchronization signal S1 when the read/write signal R/W is at logic 0.

The delay circuit 200c2 delays the first synchronization signal S1 for a pre-determined period of time to generate a third synchronization signal S3.

Then, the pre-charging pulse generator 206c generates a nimble pre-charging signal P of pulse width t according to the second synchronization signal S2 and the third synchronization signal S3. What is to be noted is that, although the first synchronization signal S1 and the third synchronization signal S3 are signals of the same phase, there is a phase difference between the two signals. The phase difference equals substantially to a width t of time.

The data detecting apparatus 200 according one embodiment of the invention is a dynamic random access memory where the data detecting apparatus 200 performs data reading operation when the read/write signal R/W is at logic 0 and the data detecting apparatus 200 performs data writing operation when the read/write signal R/W is at logic 1.

FIG. 4 shows a flow chart illustrating the data detecting method suitable for memory devices according to one embodiment of the invention. The method comprises the following steps:

Step S402: start;
Step S404: receiving a synchronization signal;
Step S406: setting a pre-determined period according to the synchronization signal and generating a nimble pre-charging signal within the pre-determined period;
Step S408: pre-charging a memory cell and a sense amplifier of the memory through a data line of the memory device for a pre-determined width of time;
Step 410: end.

The pre-determined width of time of the data detecting method can be half of the period of the synchronization signal and the pre-determined width of time can be more than zero second and less than 0.5 nanosecond.

In conclusion, a pre-charging circuit is designed in the data detecting apparatus according to the invention to output a pre-charging signal for a pre-determined width of time within the pre-determined period to the data line switch and the sense amplifier for pre-charging. Therefore, the data reading error caused by the signal accumulating effect can be avoided and the problems in the prior art are resolved.

Although the present invention has been fully described by way of examples with reference to the accompanying drawings, it should not be construed as any limitation on the range of implementation of the invention. Various equivalent changes and modifications of the shape, scope, characteristics, and spirit as described by the claims of the present invention is to be encompassed by the scope of the present invention

What is claimed is:

1. A data detecting apparatus that operates according to a first synchronization signal, the data detecting apparatus comprising:
   a plurality of memory cells;
   a plurality of data lines coupling to the plurality of memory cells separately for controlling reading or writing the plurality of memory cells;
   a plurality of bit lines coupling to the plurality of memory cells separately for outputting a datum stored in the plurality of memory cells;
   a plurality of sense amplifiers, coupling to the plurality of bit lines separately, for amplifying the data outputted from the plurality of memory cells; and at least one pre-charging circuit for setting a pre-determined period according to the first synchronization signal and generating a pre-charging signal within the pre-determined period, and for charging the memory cells and the sense amplifiers via the data lines, wherein the pre-charging circuit charges the memory cells and the sense amplifiers for a pre-determined width of time via the data lines during every half of the period of the first synchronization signal.

2. The data detecting apparatus according to claim 1, wherein the pre-determined width of time of the pre-charging signal is more than zero second and less than 0.5 nanosecond.

3. The data detecting apparatus according to claim 1, wherein the pre-charging circuit comprises:
   a synchronization controller for generating a second synchronization signal according to a read/write signal and the first synchronization signal;
   a delay circuit for delaying the first synchronization signal to generate a delayed third synchronization signal; and
   a pre-charging pulse generator for generating the pre-charging signal according to the second synchronization signal and the third synchronization signal.

4. The data detecting apparatus according to claim 1, wherein the data detecting apparatus performs data reading operation when the read/write signal is at logic 0 and the data detecting apparatus performs data writing operation when the read/write signal is at logic 1.

5. The data detecting apparatus according to claim 3, wherein the first synchronization signal and the second synchronization signal are mutually reversed-phase signals.

6. The data detecting apparatus according to claim 3, wherein the first synchronization signal and the third synchronization signal have a phase difference.

7. The data detecting apparatus according to claim 6, wherein the pre-determined width of time of the pre-charging signal is substantially the same as the phase difference.

8. The data detecting apparatus according to claim 1, being a memory device.

9. A pre-charging circuit for providing pre-charging to the target circuit that produced cumulative errors during signal propagation, the pre-charging circuit comprising:
   a synchronization controller for generating a second synchronization signal according to a read/write signal and a first synchronization signal wherein the first synchronization signal operates synchronously with the target circuit;
   a delay circuit for delaying the first synchronization signal to generate a delayed third synchronization signal; and
   a pre-charging pulse generator for generating the pre-charging signal according to the second synchronization signal and the third synchronization signal;
   wherein the pre-charging circuit sets a pre-determined period according to the first synchronization signal, generates the pre-charging signal within the pre-determined period, and charges the target circuit.

10. The pre-charging circuit according to claim 9, wherein the pre-determined width of time is substantially the same as the phase difference between the second synchronization signal and the third synchronization signal.

11. A data detecting method, applicable to a memory device, the method comprising:
    receiving a synchronization signal;
    setting a pre-determined period according to the synchronization signal and generating a nimble pre-charging signal within the pre-determined period; and
    pre-charging a memory cell and a sense amplifier of the memory through a data line of the memory device for a pre-determined width of time,
    wherein the pre-determined period equals half of the period of the synchronization signal and/or the pre-determined width of time is more than zero second and less than 0.5 nanosecond.

* * * * *